TRANSISTOR INTER-STAGE COUPLING CIRCUIT
Filed Dec. 18, 1959
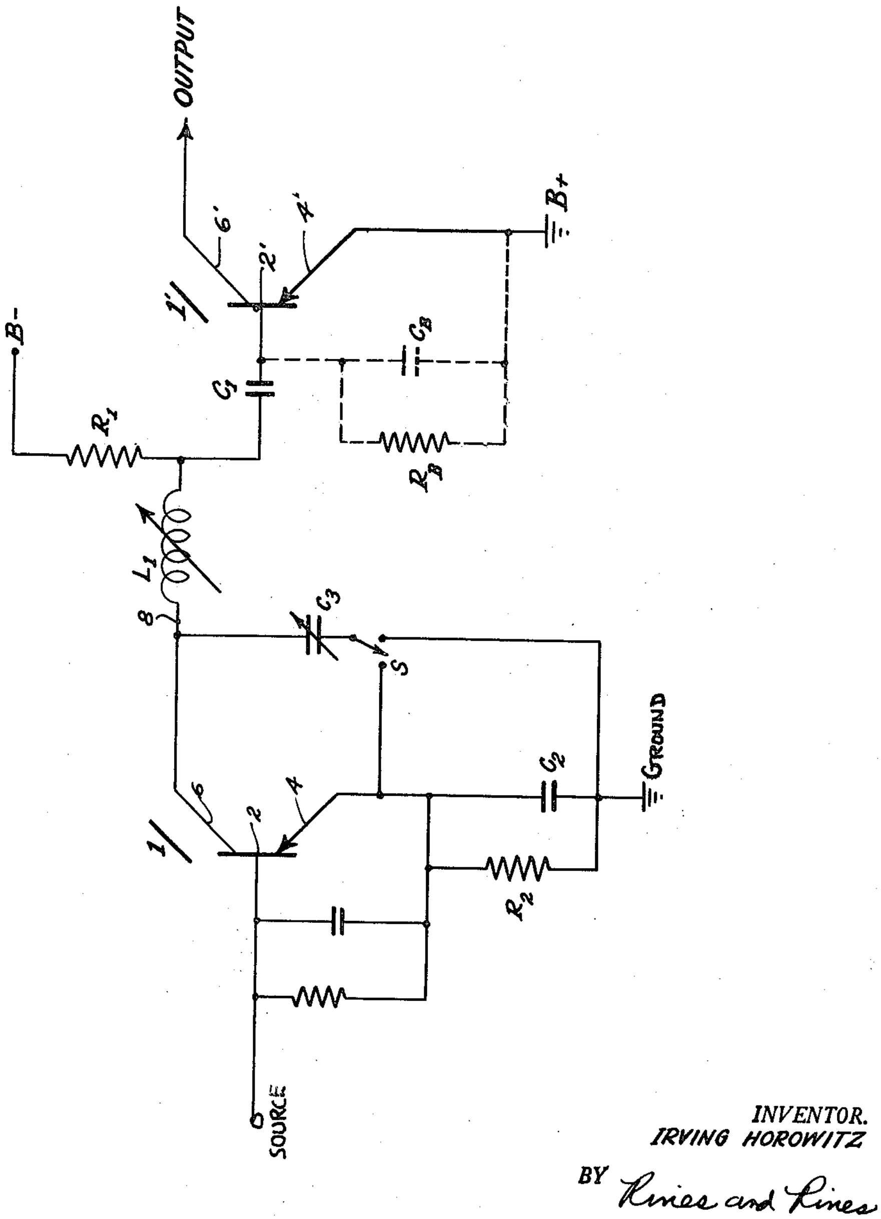
INVENTOR.
IRVING HOROWITZ
BY Rines and Rines
ATTORNEYS 3,162,820

TRANSISTOR INTER-STAGE COUPLING CIRCUIT

Irving Horowitz, Eatontown, N.J., assignor to Blonder Tongue Electronics, Eatontown, N.J., a corporation of New Jersey Filed Dec. 18, 1959, Ser. No. 860,482
9 Claims. (Cl. 330—21)

The present invention relates to transistor interstage coupling circuits and, more particularly, to peaking circuits adapted to compensate for different impedance relationships existing between the output of a transistor amplifier stage and the input of the next-succeeding transistor amplifier stage.

It has been quite conventional in transistor coupling circuits to employ shunt-peaking circuits in the interstage coupling between adjacent stages to tune out the relatively large base-to-emitter capacitance, and thereby to permit increased high-frequency gain. It has been found, however, that whatever attempts are made to vary the circuit parameters of such a system, there is an ultimate limit upon the basic input impedance of the stage being fed by a preceding stage. That input impedance is limited by the value of the base-to-emitter capacitance and resistance.

In accordance with the present invention, however, it is now possible to eliminate this restriction upon the effective input impedance of the succeeding stage through the employment of a novel type of series peaking circuit arrangement, which, in effect, acts as an impedance transformer device between the preceding stage and the next succeeding stage, obviating all the difficulties attendant upon the prior-art coupling stages. It should be observed that no such problem exists in the case of the interstage coupling between electron tubes and the like, because of the relatively high input resistance inherent in vacuum tubes at the frequencies in question, such as, for example, at video-signal transmission frequencies.

An object of the present invention, therefore, is to provide a new and improved transistor coupling circuit.

Other and further objects wil be explained hereinafter and will be more particularly pointed out in connection with the appended claims.

The invention will now be described in connection with the accompanying drawing, the single figure of which illustrates two successive transistor signal-amplifying stages constructed in accordance with a preferred embodiment. For purposes of convenience, and in order not to confuse the disclosure or to detract from the novel features of invention, the direct-current stabilizing and other controlling circuits are not shown.

A first transistor amplifier stage 1 is provided with a base 2, an emitter 4 and a collector 6, the emitter 4 being shown connected through a conventional emitter resistor $R_2$ and shunt-connected by-pass capacitor $C_2$ to ground, and the collector 6 being connected by conductor 8 through the hereinafter-described preferably variable inductance $L_1$ and coupling capacitor $C_1$ to the base 2' of the next succeeding transistor amplifier stage 1'. A source of input signals for amplification is applied between the base 2 and ground. The collector 6 is provided with bias from the negative terminal B— of a source B—, B+, the latter of which may be grounded as shown, through a resistor $R_1$ that connects with the right-hand terminal of the inductance $L_1$. It will later appear that there is a definite and important reason for the connection of $R_1$ to the right-hand terminal instead of the left-hand terminal of $L_1$.

For purposes of convenience and simplicity, the emitter 4' of the stage 1' is merely shown connected to ground, whereas, in actual practice, it may be, of course, connected to well-known emitter decoupling circuits. The collector 6' is shown connected to the ultimate output circuits. The input of the stage 1' is generally unmatched to the output of the source of signals therefor, comprising the stage 1.

The before-mentioned limitation upon the effective input impedance of the succeeding stage 1' in connection with prior-art shunt-peaking coupling circuits and the like, will be evident from a consideration of the dotted capacitor $C_B$ and resistor $R_B$, representing, respectively, the base-to-emitter capacitance and base-to-emitter resistance of the stage 1'. In accordance with the present invention, a series peaking inductor $L_1$ is used together with the effective base-to-emitter capacitance $C_B$ of the succeeding stage 1' and a purposefully introduced further capacitance $C_3$, connected from conductor 8 either in shunt with the output of stage 1 to the ground terminal when switch S is in its lower position, or to the emitter 4 when the switch S is in its upper position, for purposes later explained. This provides a series peaking circuit which is tuned to a frequency in the upper range of the response of the amplifiers 1 and 1'. By controlling the value of $C_3$, any desired impedance ratio may be obtained between the output impedance presented by the stage 1 and the effective input impedance presented by the stage 1'. This is because the circuit $L_1$, $C_3$, $C_B$ acts, in effect, as a parallel resonant transformer, effecting series peaking between stages 1 and 1'. The impedance transformation varies as the ratio of the capacitors $C_3$ and $C_B$, so that adjustment of different relative values for these capacitors will produce the desired impedance transformation. One is not thus limited in the effective input impedance of the succeeding stage 1' by the actual value of the base-to-emitter capacitor $C_B$, as in the previously described prior-art circuits. At the low frequencies of the band of frequencies to be amplified, the inductor $L_1$ acts as a normal direct-current connection so that the effective coupling circuit comprises $R_1$ and $C_1$, thereby providing broadband coupling at the low-frequency end. The purpose in connecting $R_1$ to the right-hand terminal instead of the left-hand terminal of $L_1$ resides in the fact that, had the connection been effected to the left-hand terminal, $R_1$ would shunt the peaking circuit and would thus limit its peaking action. Despite, therefore, the fact that a series peaking circuit is used, the coupling circuit of the present invention provides for broadband response both over low and high frequencies.

It has further been found that if the capacitor $C_3$, instead of being connected to the ground terminal, as in the lower position of switch S, is connected to the emitter 4, as in the upper switch position, a larger circulating current appears to pass through the incomplete by-pass capacitor $C_2$ in the emitter circuit, thereby boosting effective negative resistance presented between the base 2 and the emitter 4 and increasing the gain of the stage 1.

Typical values for such circuit connections with Type 2 N 384 transistors, involve a capacitor $C_3$ of the order of 10 micromicrofarads; a resistor $R_2$ of the order of 100 ohms; a capacitor $C_2$ of the order of 300 micromicrofarads, and a resistor $R_1$ of the order of 1000 ohms.

Further modifications will occur to those skilled in the art and all such are considered to fall within the spirit and scope of the invention, as defined in the appended claims.

What is claimed is:

1. A transistor amplifier for amplifying a wide band of signal frequencies having, in combination, a source of signals, a transistor amplifier stage the input-circuit impedance of which is unmatched to the output-circuit impedance of the source and is substantially capacitive at a predetermined signal frequency in the upper range of said band, a series inductance connected between and coupling the said output and input circuits, capacitance connected across the source, the said inductance being tuned with respect to the said capacitance and the inherent input capacitance of the transistor amplifier stage to peak the said coupling at the said predetermined upper-range signal frequency, and the said capacitance being adjusted to a value different from the said input capacitance to adjust the impedance-transformation ratio between the said output and input circuits to a desired value, the said inductance having a terminal connected by series coupling capacitance to the said input circuit and also connected to a resistive bias connection to enable broadband coupling in the lower range of the said band substantially independent of the tuned peaking of the said inductance.

2. A transistor amplifier for amplifying a wide band of signal frequencies having, in combination, a source of signals, a grounded-emitter transistor amplifier stage the input-circut impedance of which is unmatched to the output-circuit impedance of the source, a series inductance connected between and coupling the said output and input circuits, capacitance connected across the source, the said inductance being tuned with respect to the said capacitance and the inherent input capacitance of the transistor amplifier stage to peak the said coupling at a predetermined signal frequency in the upper range of the said band, and the said capacitance being adjusted to a value different from the said input capacitance to adjust the impedance-transformation ratio between the said output and input circuits to a desired value, the said inductance having a terminal connected by series coupling capacitance to the said input circuit and also connected to a resistive bias connection to enable broadband coupling in the lower range of the said band substantially independent of the tuned peaking of the said inductance.

3. A transistor amplifier for amplifying a wide band of signal frequencies having, in combination, a source of signals, a transistor amplifier stage the input-circuit impedance of which is unmatched to the output-circuit impedance of the source and is substantially capacitive at a predetermined signal frequency in the upper range of the said band, a series inductance connected between and coupling the said output and input circuits, capacitance connected across the source, the said inductance being tuned with respect to the said capacitance and the inherent input capacitance of the transistor amplifier stage to peak the said coupling at the said predetermined upper-range signal frequency, and the said capacitance being adjusted to a value small compared with the said input capacitance to adjust the impedance-transformation ratio between the said output and input circuits to a desired value, the said inductance having a terminal connected by series coupling capacitance to the said input circuit and also connected to a resistive bias connection to enable broadband coupling in the lower range of the said band substantially independent of the tuned peaking of the said inductance.

4. A transistor amplifier for amplifying a wide band of signal frequencies having, in combination, first and second transistor amplifier stages the respective output- and input-circuit impedances of which are unmatched, the said input-circuit impedance being substantially capacitive at a predetermined signal frequency in the upper range of the said band, a series inductance connected between and coupling the said output and input circuits, capacitance connected across the first amplifier, the said inductance being tuned with respect to the said capacitance and the inherent input capacitance of the second amplifier to peak the said coupling at the said predetermined upper-range signal frequency, and the said capacitance being adjusted to a value different from the said input capacitance to adjust the transformation ratio between the said output and input circuits to a desired value, the said inductance having a terminal connected by series coupling capacitance to the said input circuit and also connected to a resistive bias connection to enable broadband coupling in the lower range of the said band substantially independent of the tuned peaking of the said inductance.

5. A transistor amplifier for amplifying a wide band of signal frequencies having, in combination, first and second grounded-emitter transistor amplifier stages the respective output- and input-circuit impedances of which are unmatched, a series inductance connected between and coupling the said output and input circuits, capacitance connected across the first amplifier, the said inductance being tuned with respect to the said capacitance and the inherent input capacitance of the second amplifier to peak the said coupling at a predetermined signal frequency in the upper range of the said band, and the said capacitance being adjusted to a value different from the said input capacitance to adjust the transformation ratio between the said output and input circuits to a desired value, the said inductance having a terminal connected by series coupling capacitance to the said input circuit and also connected to a resistive bias connection to enable broadband coupling in the lower range of the said band substantially independent of the tuned peaking of the said inductance.

6. A transistor amplifier for amplifying a wide band of signal frequencies having, in combination, first and second transistor amplifier stages the respective output- and input-circuit impedances of which are unmatched the said input-circuit impedance being substantially capacitive at a predetermined signal frequency in the upper range of the said band, a series inductance connected between and coupling the said output and input circuits, capacitance connected across the first amplifier, the said inductance being tuned with respect to the said capacitance and the inherent input capacitance of the second amplifier to peak the said couplping at the said predetermined upper-range signal frequency, and the said capacitance being adjusted to a value different from the said input capacitance to adjust the transformation ratio between the said output and input circuits to a desired value, the said inductance having a terminal connected by series coupling capacitance to the said input circuit and also connected to a resistive bias connection to enable broadband coupling in the lower range of the said band substantially independent of the tuned peaking of the said inductance.

7. A transistor amplifier having, in combination, first and second transistor amplifiers each having at least a base, an emitter and a collector, means for applying a band of signals of predetermined frequencies to the first-transistor base, a circuit comprising a by-passed load for grounding the first-transistor emitter, a series inductance connected between and coupling the first-transistor collector and the second-transistor base, means for grounding the second-transistor emitter, capacitance connected between the first-transistor collector and a point of the said first-transistor emitter-grounding circuit, the said inductance being tuned with respect to the said capacitance and the inherent input capacitance of the second transistor to peak the said coupling at one of the upper of the said predetermined frequencies, and the said capacitance being adjusted to a value small compared to the said input capacitance to adjust to a predetermined value the transformation ratio between the impedance from the first-transistor collector to ground and the impedance from the second-transistor base to ground, the said inductance having a terminal connected by series coupling capacitance to the second-transistor base and also connected to a resistive bias connection to enable broad-band coupling in the lower range of the said band substantially independent of the tuned peaking of the said inductance.

8. A transistor amplifier as claimed in claim 7 and in which the said point is the emitter.

9. A transistor amplifier as claimed in claim 7 and in which the said point is ground.

References Cited in the file of this patent

UNITED STATES PATENTS

| | | |
|---|---|---|
| 2,790,035 | Hylas | Apr. 23, 1957 |
| 2,811,590 | Doremus | Oct. 29, 1957 |
| 2,812,390 | Van Overbeek | Nov. 5, 1957 |
| 2,936,424 | Steggerda | May 10, 1960 |

OTHER REFERENCES

Chow et al.: Transistor Circuit Engineering, New York, John Wiley & Sons, Inc., 1957, page 172.